(12) United States Patent
Bachl et al.

(10) Patent No.: US 7,008,080 B2
(45) Date of Patent: Mar. 7, 2006

(54) PASSIVE RADIATION OPTICAL SYSTEM MODULE ESPECIALLY FOR USE WITH LIGHT-EMITTING DIODES

(75) Inventors: Bernhard Bachl, Regensburg (DE); Simon Blümel, Schierling (DE); Günter Kirchberger, Sinzing (DE); Harald Stoyan, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 7 days.

(21) Appl. No.: 10/333,635

(22) PCT Filed: Jun. 13, 2001

(86) PCT No.: PCT/DE01/02191

§ 371 (c)(1),
(2), (4) Date: Jun. 12, 2003

(87) PCT Pub. No.: WO02/07131

PCT Pub. Date: Jan. 24, 2002

(65) Prior Publication Data

US 2004/0012957 A1 Jan. 22, 2004

(30) Foreign Application Priority Data

Jul. 18, 2000 (DE) .............................. 100 34 886

(51) Int. Cl.
*F21V 21/00* (2006.01)
(52) U.S. Cl. ...................... 362/249; 362/252; 362/237; 362/241; 362/800
(58) Field of Classification Search ................ 362/249, 362/252, 800, 545, 236, 237, 238, 240, 241, 362/247
See application file for complete search history.

(56) References Cited

U.S. PATENT DOCUMENTS

| | | | | |
|---|---|---|---|---|
| 4,845,405 A | * | 7/1989 | Yamane et al. ............. | 313/500 |
| 5,660,461 A | | 8/1997 | Ignatius et al. | |
| 6,412,971 B1 | * | 7/2002 | Wojnarowski et al. ...... | 362/249 |
| 6,461,008 B1 | * | 10/2002 | Pederson ..................... | 362/35 |
| 6,623,151 B1 | * | 9/2003 | Pederson ..................... | 362/542 |
| 6,707,389 B1 | * | 3/2004 | Pederson ............... | 340/815.45 |

FOREIGN PATENT DOCUMENTS

| | | |
|---|---|---|
| CH | 689 339 | 2/1999 |
| DE | 93 07 862.5 | 7/1993 |
| DE | 298 18 609 | 2/1999 |
| DE | 298 22 207 | 3/1999 |
| JP | 4-213401 | 8/1992 |
| WO | WO 99/41785 | 8/1999 |

* cited by examiner

*Primary Examiner*—Thomas M. Sember
(74) *Attorney, Agent, or Firm*—Cohen, Pontani, Lieberman & Pavane

(57) ABSTRACT

A passive radiation optical system includes a one-piece module having a plurality of individual optical components wherein the one-piece module is radiation-permeable or reflective. The optical components are connected to one another via predetermined breaking points for forming a radiation optical system module. In addition, the one-piece module can be separated to form optical components that include one or more individual optical components. The one-piece module is particularly for use with light emitting diodes. The passive radiation optical system module is suitable for mass production, and because of its modular principle, it enables flexible adaptation to the shape and size of the desired lighting device, such as lighted advertising or safety lighting.

15 Claims, 3 Drawing Sheets

PASSIVE RADIATION OPTICAL SYSTEM MODULE ESPECIALLY FOR USE WITH LIGHT-EMITTING DIODES

This is a U.S. National Phase Application under 35 USC 371 of International Application PCT/DE01/02191, filed on Jul. 18, 2000.

FIELD OF THE INVENTION

The present invention relates to a passive radiation optical system module, particularly for use with light-emitting diodes.

BACKGROUND OF THE INVENTION

It is known to use arrays of light-emitting diodes (LEDs), mounted on printed circuit boards, for lighting purposes. For instance in lighted advertising, such as backlighted letters, plastic backlighting, and so forth; in safety lighting, such as escape route lighting, orientation lighting, marking lighting systems; and in lighting systems for motor vehicles, it is known, instead of conventional incandescent bulbs or gas discharge bulbs, to use LEDs, which have a longer service life, better efficiency in converting electrical energy into radiation energy in the visible spectral range, and associated with it a lesser power loss and a lesser requirement for space. Particularly in lighted advertising, the high flexibility in terms of geometrical shaping and the versatility of coloring that LEDs offer has great significance.

In German Utility Model DE 298 18 609 U1, an array of circuit boards for arbitrarily setting up LED lighting units is disclosed, in which many circuit boards are provided that carry light-emitting diodes and that cohere superficially, are embodied polygonally, and are joined together by webs. From this matrix-like array of circuit boards, an arbitrary number or partial quantity of the LED-carrying circuit boards can be broken out, resulting in partial quantities that have versatile design options in terms of the geometrical dimensions.

In International Patent Disclosure WO 99/41785, an LED light panel that can be preassembled is disclosed. It includes a number of LED chips, onto each of which an optically transparent protective layer is applied. The light panel can be broken apart into subsidiary units.

Normally, light-emitting diodes have an essentially point-shaped light source, which has a conical beam with an opening angle of 120° for instance.

SUMMARY OF THE INVENTION

One object of the present invention is to provide an optical system that can be produced in a simple way by mass production and enables flexible adaptation to given geometric conditions.

According to the invention, the object is attained with a passive radiation optical system module, in particular for use with light-emitting diodes, having a plurality of individual passive radiation optical components,
which are radiation-permeable or reflective, and
which are connected to one another, for forming the passive radiation optical system module, via connecting means that are embodied as predetermined breaking points.

An individual radiation optical component is understood to be a beam-forming and/or beam-deflecting optical element, such as focusing lenses, scattering lenses, prisms, or reflectors.

The passive radiation optical system module, hereinafter also called a multiple optical panel, is preferably made in one piece.

The passive radiation optical system module is preferably embodied as a completely passive optical panel.

Another object of the invention is to provide a multiple optical panel of modular construction, which has many solidly joined-together individual optical components; the multiple optical panel can be broken apart into optical units that can include a plurality of individual optical components. As a result, there is great flexibility in terms of shaping the optical units that can be produced with the multiple optical panel, since easy adaptation to given geometric conditions is possible.

Between the individual components, predetermined breaking points are provided. The predetermined breaking points may be provided along a closed line, along the circumference of the individual components. As a result, without using a tool, the user can break the multiple optical panel apart, for instance along one edge, into optical units that include one or more individual optical components.

Although the multiple optical panel can be produced by a mass production method, applications for individual items or small-scale production can be made possible that would otherwise require special development, such as the production of special injection molds.

The multiple optical panel is especially advantageous in conjunction with a multiple array of LED-equipped printed circuit boards, which likewise makes subsidiary quantities of solidly joined-together printed circuit boards possible, with an arbitrarily selectable number of light-emitting diodes and a virtually arbitrary shaping.

The geometric shaping of the individual components, and in particular of the predetermined breaking points, can be adapted to the shaping of the individual printed circuit boards with LEDs that form the multiple array.

A modular construction created on the above principle makes a high flexibility of usage possible, since arbitrarily separable optical units of various properties, such as color, material, and light focusing or scattering, and so forth, can be combined arbitrarily with multiple LED panels that can likewise be broken apart arbitrarily. A plurality of optical units of different properties, such as different light exit angles, can advantageously be combined for instance with one multiple LED panel, for instance by being put together.

The multiple optical panel can be produced in a simple way, for instance by an injection molding process. In applications that have large surfaces that have to be lighted or backlighted, a plurality of multiple optical panels can be joined together.

In an advantageous embodiment of the present invention, the multiple optical panel has individual optical components arranged in a two-dimensional matrix structure. This kind of multiple optical panel is especially simple to produce and can be used especially flexibly.

In another advantageous embodiment of the present invention, the individual components have a square bottom face. Each individual component represents one cell of the matrix structure, which is made up of rows and columns.

In another advantageous embodiment of the present invention, for forming the predetermined breaking points, zones of reduced material thickness are provided. If the predetermined breaking points are formed by zones of reduced material thickness, then the multiple optical panel can have a smooth, uninterrupted surface that is simple to clean. Moreover, injection molds that have zones of reduced material thickness can be produced simply and with little effort or expense.

In another embodiment of the present invention, the multiple optical panel has a smooth surface. As a result, even in optical units that include a plurality of individual optical components, and in which each individual optical component is assigned its own light-emitting diode, a homogeneous light density without a visible transition between the individual optical components can be attained. This homogeneous light density, or uniform distribution of brightness, is independent of the size and geometric shaping of the desired application and hence of the optical unit.

In a further advantageous embodiment of the present invention, for forming the predetermined breaking points, webs between the individual components are provided. Predetermined breaking points formed by webs are especially simple to produce and can be easily separated by the user either by hand or by machine.

In another advantageous embodiment of the present invention, the individual optical elements each have means for generating a homogeneous light density on a surface that is visible to the observer when light radiation strikes it. As a result, for instance, uniformly brightly-lighted company logos, lighted writing, and so forth can be achieved.

In another advantageous embodiment of the present invention, the multiple optical panel is made entirely of the material known as PMMA (polymethylmethacrylate).

PMMA is widely available, makes easy manipulation in production possible, has excellent optical properties, and can be colored in a simple way, which is especially important in lighted advertising and safety lighting, such as lighting that marks escape routes. Alternatively, the multiple panel can be made entirely of the material known as polycarbonate.

In a further advantageous embodiment of the present invention, the individual optical components have the same geometrical shape as one another. This makes a high degree of modularity possible, along with simple molding, for instance for an injection molding process, as well as good homogeneity of the light distribution.

The individual optical components and thus the multiple optical panel can each have reflective, scattering, or focusing optical elements, depending on the application.

The principle involved here avoids the requirement that special LED optical elements be developed and produced for individual applications, such as company logos, lighted advertisements, and so forth.

DETAILED DESCRIPTION OF THE DRAWINGS

FIG. 1a shows a multiple optical panel 1 with a plurality of individual optical components 2 of square bottom face, disposed in a matrixlike structure. Between the individual optical components 2, predetermined breaking points 3 are provided along the edges of the individual optical components 2. The predetermined breaking points 3 are disposed in two directions orthogonal to one another. The predetermined breaking points 3 are realized by providing that along the predetermined breaking points 3, the material thickness of the multiple optical panel 1 is so slight that it is possible to break the multiple optical panel 1 apart easily, by machine or by hand, into optical units that include one or more individual optical components 2. For instance, breaking the multiple optical panel 1 apart into optical units that include one or more individual optical components 2 can be done manually along a fracture edge, without using a tool.

Each individual optical component 2 has an optical element that is associated with a respective light-emitting diode or laser diode. The optical element of an individual optical component 2 converts incident light, which is projected conically from a point-shaped light-emitting diode, into a parallel beam path of homogeneous light density. For this purpose, a Fresnel lens can for instance be used.

The array of FIG. 1a has the advantage that the multiple optical panel can be produced in a simple way by a mass production process, such as injection molding. Because of the matrixlike construction of the multiple optical panel, with many individual optical components 2 disposed in an array, which are identical to one another in their geometrical dimensions, a simple, flexible adaptation of the size of the desired optical array and hence of the optical unit, for an arbitrary number of joined individual optical components is possible. The predetermined breaking points 3 of reduced material thickness of the PMMA (polymethylmethacrylate) material, because of the attainable homogeneous light density over a plurality of individual optical components, in common with suitably designed light-emitting diodes, allow the realization of safety lighting devices, effect lighting systems, and lighted advertising.

Figure 1:
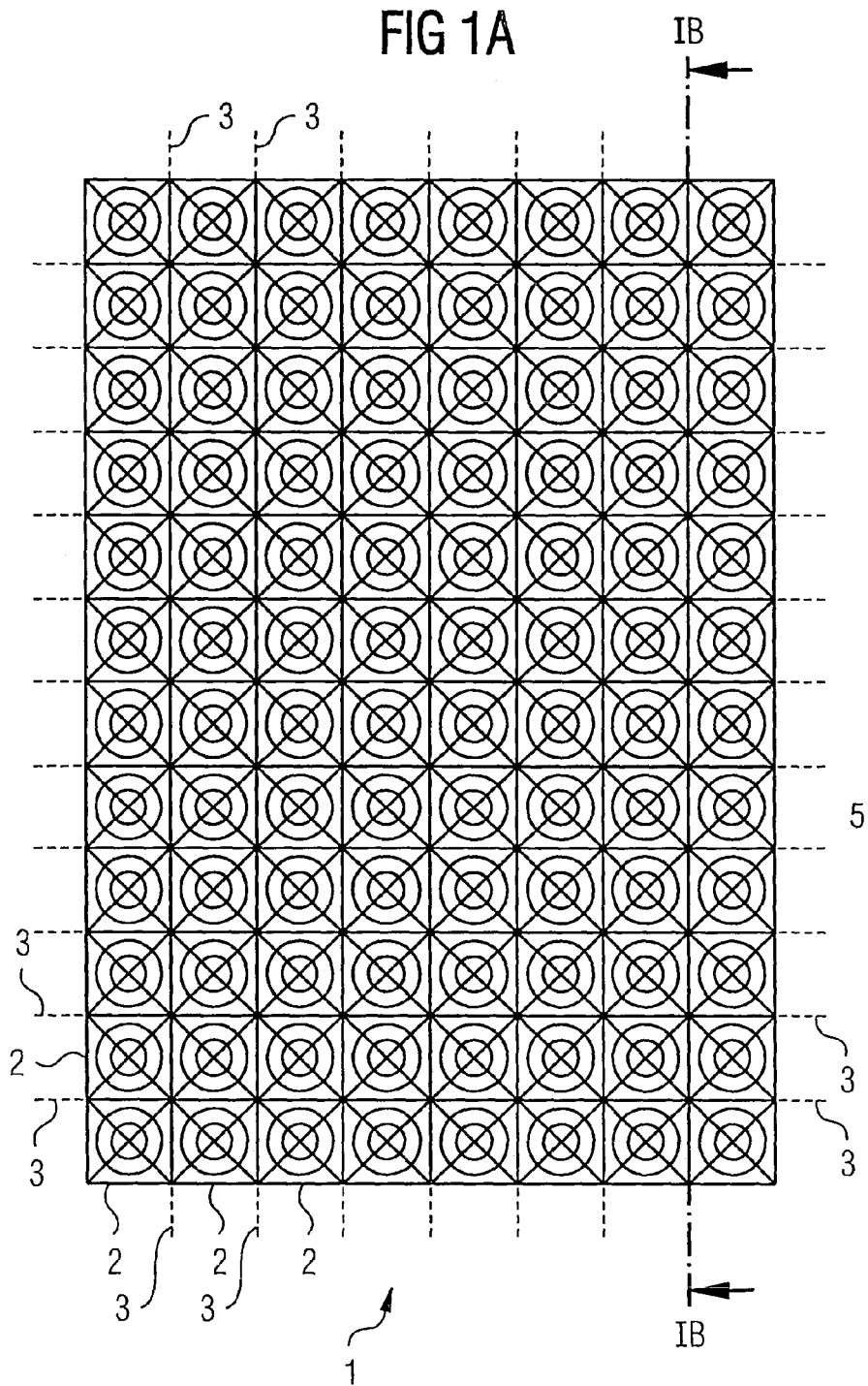
FIG. 1a, a multiple optical panel with square individual components, in a plan view.
FIG. 1b, the multiple optical panel of FIG. 1a in a side view.

In a departure from the embodiment of FIG. 1, depending on the application, the optical element of the individual optical components can also be embodied as reflective, scattering, or focusing. If the number of individual optical components in one multiple optical panel, or the dimensions of the multiple optical panel, should be inadequate for the particular application, then a plurality of multiple optical panels can for instance be joined together by adhesive bonding, in order to achieve an arbitrarily large surface.

FIG. 1b shows a cross section through the multiple optical panel 1 of FIG. 1a. The predetermined breaking points 3, with a reduced material thickness, between the individual optical components 2 are clearly visible. The front side 4 of the multiple optical panel, or of the individual optical components 2, has a smooth surface, so that soiling, for instance in use outdoors, remains slight, and cleaning is easily possible. The back side 5 of each individual optical component 2 has an insertion opening for a light-emitting means, such as a light-emitting diode or a laser diode.

Figure 2:
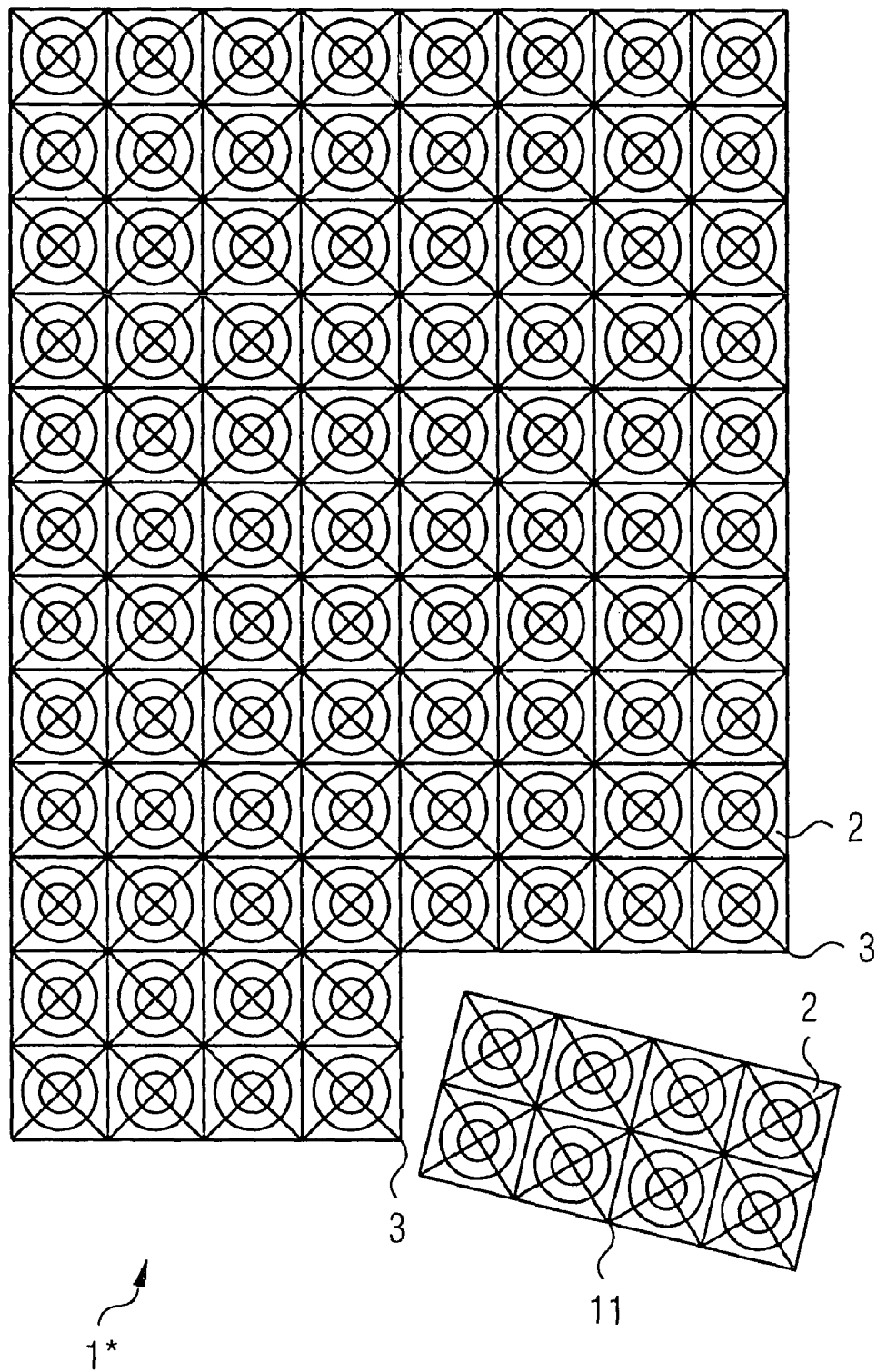
FIG. 2, the multiple optical panel of FIG. 1a, from which an optical unit including a plurality of individual optical components has been cut out.

FIG. 2 shows a multiple optical panel 1, from which an optical unit 11 that includes eight individual optical components 2 has been separated along desired breaking points 3 between the individual optical components 2. It is understood that the remaining multiple optical panel 1* and the optical unit 11 can both be broken apart along further predetermined breaking points 3 to form still other individual optical components.

Figure 3A:
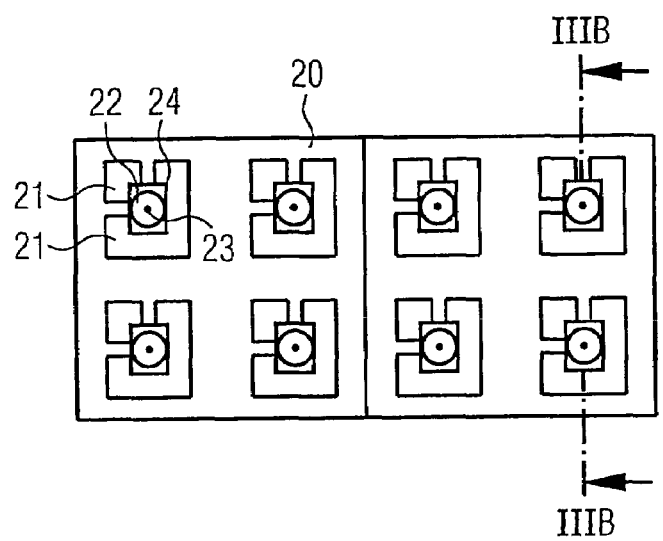
FIG. 3a, a multiple array of LED-equipped printed circuit boards, in a plan view.

FIG. 3*a* shows a multiple array 20 of LED-equipped printed circuit boards; the multiple array 20 has a plurality of LED chips 24, which are disposed with large-area contacts 21 on the printed circuit board 20. Each LED chip 24 has the actual LED light source 23 as well as a reflector 22. Once again, this makes for a modular structure of light-emitting diodes, so that once again arbitrary numbers of light-emitting diodes that firmly cohere to one another can be created.

Figure 3B:
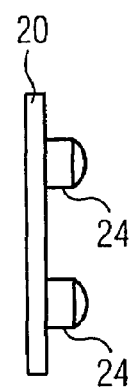
FIG. 3b, the multiple array of FIG. 3a in a side view.

FIG. 3*b* shows a cross section through the multiple array of LED-equipped printed circuit boards 20 with LED chips 24 as in FIG. 3*a*. The LED chips are shaped such that together with a back side 5 of the individual optical components 2 that has an insertion opening, a plug connection can be made.

Figure 4A:
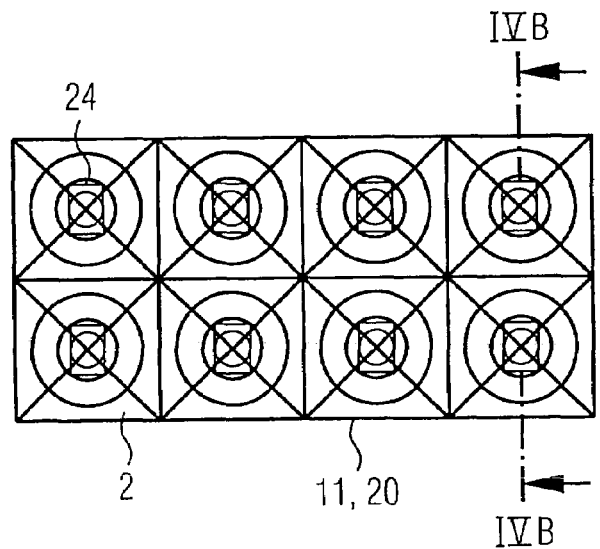
FIG. 4a, the multiple array of FIG. 3a, with an optical unit of FIG. 2, in a plan view.

FIG. 4*a* shows the optical unit 11 of FIG. 2, mounted on the multiple array of LED-equipped printed circuit boards 20. It can be seen that the center points of the individual optical components 2 of the optical unit 11 are each disposed such that they match the LED light sources 23. Thus each individual optical component 2 is associated with one LED chip 24.

Figure 4B:
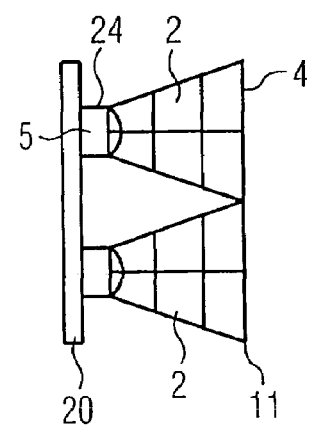
FIG. 4b, the multiple array with an optical unit of FIG. 4a, in a side view.

FIG. 4*b* shows a cross section through the connection of the optical unit 11 and multiple array of LED-equipped printed circuit boards 20 of FIG. 4*a*. The individual optical components 2 are each mounted by their back side 5 on the LED chip 24 of the multiple array of LED-equipped printed circuit boards 20. It can be seen that the individual optical components 2 and the overall optical unit 11 have a flat, smooth surface.

Besides the square shape, described, of the individual optical components 2, these components can also have other shapes, such as hexagonal, triangular, rectangular, and so forth.

What is claimed is:

1. A passive optical one-piece module for use with light-emitting diodes, said passive optical one-piece module consisting of a homogeneous material and comprising:
    a plurality of individual passive optical components, which are radiation-permeable or reflective, and
    predetermined breaking points arranged in said passive optical one-piece module.

2. The passive optical one-piece module of claim 1, wherein said plurality of individual passive optical components are arranged in a two-dimensional matrix structure.

3. The passive optical one-piece module of claim 2, wherein each of said individual passive optical components has a square bottom face and forms one cell of said two-dimensional matrix structure, said cell being defined by rows and columns of said two-dimensional matrix structure.

4. The passive optical one-piece module of claim 1, wherein zones of reduced material thickness are provided for forming said predetermined breaking points.

5. The passive optical one-piece module of claim 1, wherein webs between at least two optical components of said individual passive optical components form said predetermined breaking points.

6. The passive optical one-piece module claim 1, wherein said passive optical one-piece module has a smooth surface.

7. The passive optical one-piece module of claim 6, wherein individual optical components of said individual passive optical components have means for generating a homogeneous light density at said smooth surface in the event of incident radiation.

8. The passive optical one-piece module of claim 1, wherein said homogeneous material of said passive optical module comprises PMMA.

9. The passive optical one-piece module of claim 1, wherein each of said individual passive optical elements has an identical geometric shape.

10. The passive optical one-piece module of claim 1, wherein each of said individual passive optical components has a back side with a plug-in opening for receiving a light-emitting diode.

11. The passive optical one-piece module of claim 1, wherein each optical component of said plurality of individual passive optical components is connected to the others of said plurality of individual passive optical components by at least one of said breaking points.

12. The passive optical one-piece module of claim 1, wherein said predetermined breaking points are formed by said homogeneous material of said individual passive optical components.

13. A passive optical one-piece module, comprising:
    a plurality of individual passive optical components, each of said optical components being radiation permeable or reflective; and
    breaking points arranged in said optical module, wherein the breaking points are arranged in material of said passive optical components.

14. The passive optical one-piece module of claim 13, wherein each optical component of said plurality of individual passive optical components is connected to the others of said plurality of individual passive optical components by at least one of said breaking points.

15. The passive optical one-piece module of claim 13, wherein each of said breaking points is formed from material of two adjacent ones of said plurality of individual passive optical components.

* * * * *